US009666256B1

(12) United States Patent
Lai et al.

(10) Patent No.: US 9,666,256 B1
(45) Date of Patent: May 30, 2017

(54) SPIN-ORBIT TORQUE MAGNETIC RANDOM ACCESS MEMORY AND METHOD OF WRITING THE SAME

(71) Applicant: National Tsing Hua University, Hsinchu (TW)

(72) Inventors: Chih-Huang Lai, Hsinchu (TW); Kuo-Feng Huang, Hsinchu (TW); Hsiu-Hau Lin, Hsinchu (TW); Ding-Shuo Wang, Hsinchu (TW); Ming-Han Tsai, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/374,606

(22) Filed: Dec. 9, 2016

(30) Foreign Application Priority Data

Mar. 15, 2016 (TW) .............................. 105107887 A

(51) Int. Cl.
| | |
|---|---|
| *G11C 11/18* | (2006.01) |
| *G11C 11/16* | (2006.01) |
| *H01L 43/02* | (2006.01) |
| *H01L 43/08* | (2006.01) |
| *H01L 43/10* | (2006.01) |
| *H01L 43/06* | (2006.01) |

(52) U.S. Cl.
CPC ........ *G11C 11/161* (2013.01); *G11C 11/1675* (2013.01); *G11C 11/18* (2013.01); *H01L 43/02* (2013.01); *H01L 43/065* (2013.01); *H01L 43/08* (2013.01); *H01L 43/10* (2013.01)

(58) Field of Classification Search
CPC ..................................................... G11C 11/18
USPC ......................................................... 365/158
See application file for complete search history.

(56) References Cited

U.S. PATENT DOCUMENTS

| | | | | |
|---|---|---|---|---|
| 8,963,222 | B2 * | 2/2015 | Guo ........................ | H01L 43/04 257/295 |
| 9,343,658 | B2 | 5/2016 | Wang et al. | |
| 2014/0001524 | A1 * | 1/2014 | Manipatruni .......... | H01L 43/08 257/295 |
| 2015/0036415 | A1 * | 2/2015 | Di Pendina ............. | G11C 11/18 365/148 |

(Continued)

OTHER PUBLICATIONS

Huai, "Spin-Transfer Torque MRAM (STT-MRAM): Challenges and Prospects", AAPPS Bulletin, Dec. 2008, vol. 18, No. 6, pp. 33-40.

(Continued)

*Primary Examiner* — Son Mai
(74) *Attorney, Agent, or Firm* — Birch, Stewart, Kolasch & Birch, LLP

(57) ABSTRACT

An SOT-MRAM comprises a substrate, and an SOT memory cell disposed on the substrate and including a magnetic free layer. The magnetic free layer includes a first metal film exhibiting ferromagnetic characteristics, and a second metal film for generating a spin-Hall effect. The first metal film has a thickness sufficient to allow the magnetic free layer, after being applied with a first external magnetic field which is subsequently removed, to have a magnetization ratio ranging from −0.9 to 0.9. The first metal film, upon being applied with a second external magnetic field and an electric pulse, has multiple magnetic domains when a current density resulting from the electric pulse is greater than a critical value.

19 Claims, 19 Drawing Sheets

(56) References Cited

U.S. PATENT DOCUMENTS

2015/0200003 A1\* 7/2015 Buhrman ................ G11C 11/18
365/158

OTHER PUBLICATIONS

Kim et al., "Multilevel Spin-Orbit Torque MRAMs", IEEE Transactions on Electron Devices, Feb. 2015, vol. 62, No. 2, pp. 561-568.

\* cited by examiner

SPIN-ORBIT TORQUE MAGNETIC RANDOM ACCESS MEMORY AND METHOD OF WRITING THE SAME

CROSS-REFERENCE TO RELATED APPLICATION

This application claims priority of Taiwanese Patent Application No. 105107887, filed on Mar. 15, 2016.

FIELD

The disclosure relates to a random access memory (RAM), more particularly to a spin-orbit torque magnetic random access memory (SOT-MRAM) and a method of writing the same.

BACKGROUND

In recent decades, the ever increasing data-updating speed stimulates the demands not only on storage capacity of random access memories (RAMs), but also on the writing speed thereof.

Conventional RAMs mainly include Flash Memories, Resistive RAMs (ReRAMs), Phase Change RAMs (PCRAMs), and Ferroelectric RAMs (FeRAMs), etc. Memory cells in the aforesaid RAMs usually adopt a so-called two-terminal approach (i.e., to have both a bit line and a write line) for data transmission, and may be implemented into multilevel structures to reduce their sizes and to accordingly increase an areal density. However, such conventional RAMs require an initialization procedure prior to their data writing-in writing/rewriting process, the memory cells need to be initialized into a low resistance state (LRS), and such initialization procedure is energy and time consuming.

On the other hand, due to the discovery of tunneling magnetoresistance (TMR), Magnetic Random Access Memories (MRAMs) composed of a magnetic free layer, an insulating barrier layer and a ferromagnetic pin layer have come into play in recent years and are deemed as a promising next generation memory technology. Such MRAMs have their logic levels, e.g., 0 and 1, determined by manipulating magnetic moments of the free layer via electron spinning under applied currents and external magnetic fields, such that the resistance of memory cells can be altered accordingly. Conventional MRAMs include spin-transfer torque magnetic random access memories (STT-MRAMs) and spin-orbit torque magnetic random access memories (SOT-MRAMs).

Referring to FIG. 1, Yiming Huai et al. discloses a conventional STT-MRAM 1 in "Spin-Transfer Torque MRAM (STT-MRAM): Challenges and Prospects", AAPPS Bulletin December 2008, Vol. 18, No. 6, pp. 33 to 40 (hereinafter Reference 1), including a silicon substrate 11 having a transistor 111 formed thereon, an STT memory cell 12 (i.e., a magnetic tunnel junction (MTJ)) electrically coupled to and disposed on the transistor 111, and a bit line 13 disposed on the STT memory cell 12. The STT memory cell 12 includes a free layer 121 electrically connected to the bit line 13, a pin layer 122 electrically connected to the transistor 111, and an MgO tunnel barrier layer 123 disposed between the free layer 121 and the pin layer 122. The transistor 111 serves as a word line for reading and writing data from the STT memory cell 12. However, during the write-in operation of the conventional STT-MRAM 1, a relatively high writing voltage (current) is applied across the STT memory cell 12, which may damage the free layer 121, as well as the MgO tunnel barrier layer 123, and result in reliability issues such as time-dependent dielectric breakdown.

Referring to FIG. 2, Yusung Kim et al. discloses a conventional SOT-MRAM 2 in "Multilevel Spin-Orbit Torque MRAMs", IEEE Transactions on Electron Devices, Vol. 62, No. 2, February 2015 (hereinafter Reference 2), which may solve the aforesaid issue for the conventional STT-MRAMs. The conventional SOT-MRAM 2 includes an SOT memory cell 21 (i.e., the magnetic tunnel junction) and a heavy metal layer 22. The SOT memory cell 21 has a free layer 211, a pin layer 212, and a tunnel barrier layer 213. The heavy metal layer 22 electrically contacts the free layer 211 and is electrically connected to a write-in bit line 23. The pin layer 212 is electrically connected to a read bit line 24, where the write-in bit line 23 is arranged interlacingly with the read bit line 24 and a bit line 25, so as to constitute a three-terminal configuration for signal transmission. Writing of such conventional SOT-MRAM 2 can be realized by injecting the spin current, which is generated from spin-orbit interaction caused by the current flowing in the heavy metal layer 22, into the free layer 211 so as to reverse the magnetic moments of the free layer 211. However, the occupied volume of such SOT memory cell 21 is relatively large due to the three-terminal configuration, and the areal cell density of the same may thus be relatively low.

In order to solve such issue, Kim et al. discloses another SOT-MRAM 3 in Reference 2 as illustrated in FIGS. 3 and 4, where the memory cells thereof include a first SOT cell 31 (i.e., the mtj), a second SOT cell 32 and a heavy metal layer 33, where the first and second SOT cells 31, 32 are connected in series (see FIG. 3) or in parallel (see FIG. 4) so as to create four resistive states and to achieve multilevel storage. However, such multilevel storage is achieved by increasing the number of the SOT cells 31, 32, which may still result in a relatively large occupied volume of the SOT-MRAM 3 and would not be able to increase the areal density of the memory cells.

SUMMARY

According to one aspect of the present disclosure, a spin-orbit torque magnetic random access memory (SOT-MRAM) may be provided. The SOT-MRAM includes a substrate and an SOT memory cell. The SOT memory cell is disposed on the substrate and includes a magnetic free layer. The magnetic free layer includes a first metal film exhibiting ferromagnetic characteristics, and a second metal film contacting the first metal film for generating a spin-Hall effect. The first metal film has a thickness sufficient to allow the magnetic free layer, after being applied with a first external magnetic field which is subsequently removed, to have a remanent-to-saturated magnetization ratio ranging from −0.9 to 0.9. The first metal film, upon being applied with a second external magnetic field and an electric pulse, has multiple magnetic domains when a current density resulting from the electric pulse is greater than a critical value. The magnetic free layer has a magnetic switching behavior when the current density reaches the critical value. The second external magnetic field is provided in a direction identical to the first external magnetic field and is less in magnitude than the first external magnetic field.

According to another aspect of the present disclosure, a method of writing the aforesaid SOT-MRAM includes the steps of:

applying a first external magnetic field to the magnetic free layer of the SOT memory cell and subsequently removing the first external magnetic field, such that the first metal film has a remanent-to-saturated magnetization ratio ranging from −0.9 to 0.9; and applying a second external magnetic field and a first electric pulse to the magnetic free layer of the SOT memory cell, such that the second metal film generates a first self-spinning current via the spin-Hall effect and reverses magnetic moments of the first metal film upon a resulting current density reaching the critical value, wherein the magnetic free layer has one of positively-saturated and negatively-saturated magnetizations upon the current density reaching the critical value.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
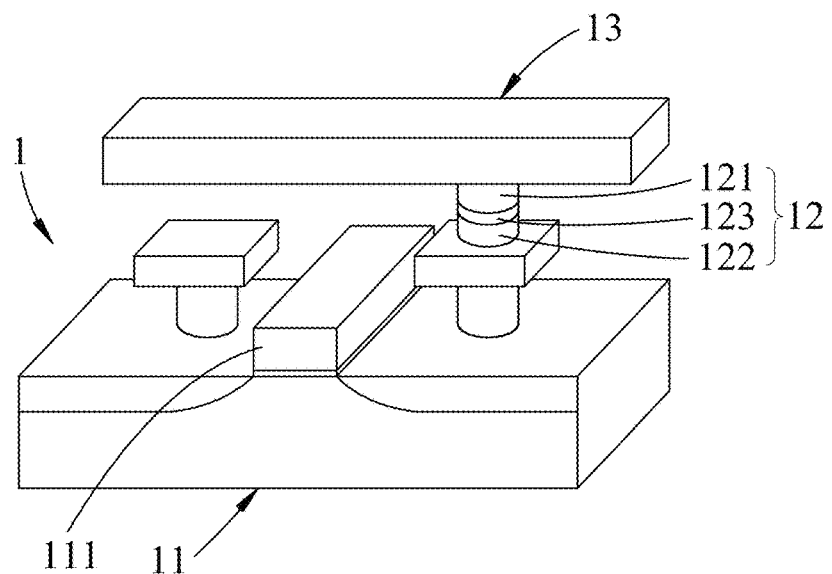
FIG. 1 is a schematic perspective view of a conventional STT-MRAM disclosed in Reference 1.
Figure 2:
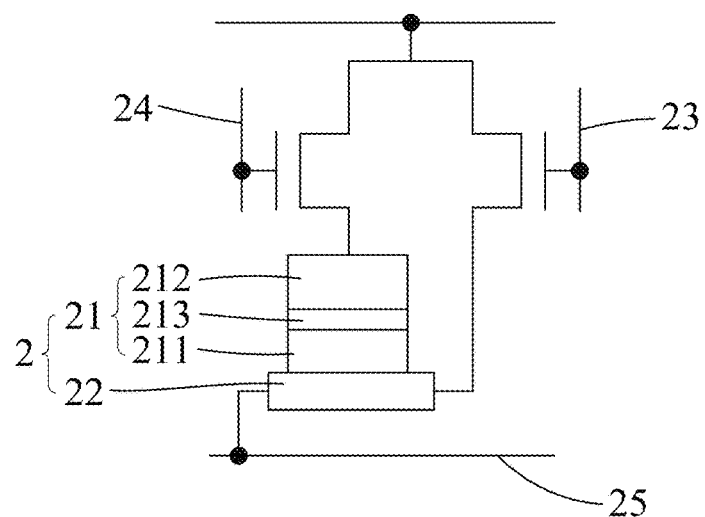
FIG. 2 is a circuit diagram of a conventional SOT-MRAM disclosed in Reference 2.
Figure 3:
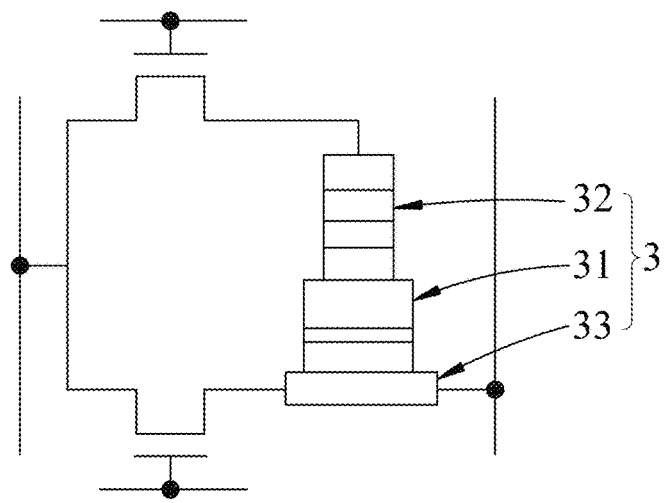
FIG. 3 is a circuit diagram of a conventional multilevel SOT-MRAM disclosed in Reference 2.
Figure 4:
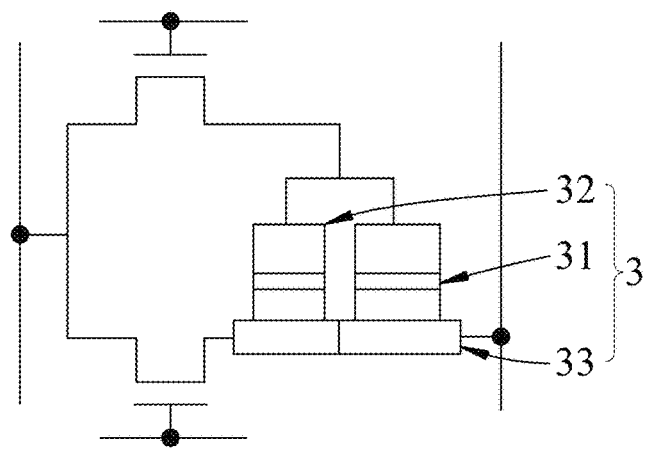
FIG. 4 is a circuit diagram of another conventional multilevel SOT-MRAM disclosed in Reference 2.
Figure 5:
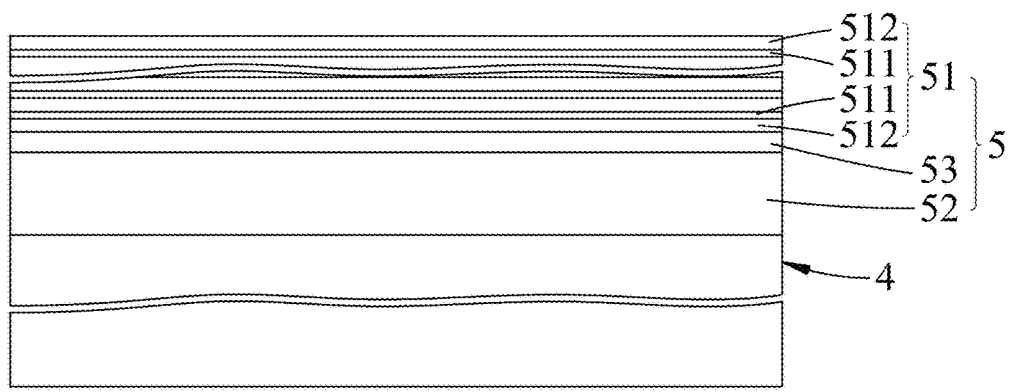
FIG. 5 is a schematic front view illustrating one embodiment of an SOT-MRAM according to the present disclosure.

Referring to FIG. 5, one embodiment of a spin-orbit torque magnetic random access memory (SOT-MRAM) according to the present disclosure includes a substrate 4, and an SOT memory cell 5 disposed thereon.

In certain embodiments, the SOT memory cell 5 includes a magnetic free layer 51 disposed on the substrate 4, a magnetic pin layer 52 disposed on the substrate 4, and a barrier layer 53 disposed between the magnetic free layer 51 and the magnetic pin layer 52 as illustrated in FIG. 5. In such embodiments, the magnetic free layer 51 may include a plurality of first metal films 511 exhibiting ferromagnetic characteristics, and a plurality of second metal films 512 stacked with the first metal films 511 as illustrated in FIG. 5 for generating the spin-Hall effect (SPE). Each first metal film 511 has a thickness sufficient to allow the magnetic free layer 51, after being applied with a first external magnetic field which is subsequently removed, to have a remanent-to-saturated magnetization ratio (also known as the Kerr Intensity) ranging from −0.9 to 0.9. It may be noted that (+) or (−) signs simply refer to the positive and negative directions. It should be noted that, the first external magnetic field may be applied in a first direction (+X) which may be parallel to a hard axis of the first metal film 511. It may also be noted that the first external magnetic field may be applied in other directions instead of the first direction (+X), so long as the first metal films 511 have such a remanent-to-saturated magnetization ratio.

In certain embodiments, each first metal film 511 may include a first metal selected from the group consisting of Co, Fe, Ni, and combinations thereof. In certain embodiments, each second metal film 512 may be made of a second metal, or made of a third metal which is doped with a fourth metal. For instance, the second metal may be selected from the group consisting of Pd, Pt, Ta, Mo, and W, the third metal may be selected from the group consisting of Cu, Pt, W and combinations thereof, and the fourth metal may be selected from the group consisting of Ir, Pt, W, Bi, and combinations thereof. In certain embodiments, each first metal film 511 includes Co, each second metal film 512 is made of Pt, and the magnetic free layer 51 includes two first metal films 511 and two second metal films 512 alternately stacked with each other, so as to constitute a $(Pt/Co)_n/X$ multilayered structure, where n is 2 and X is Pt. In certain embodiments, the first metal film 511 may exhibit perpendicular magnetic anisotropy.

It may be noted that, magnetic polarization of the first metal and the content of the first metal in the first metal film 511 may also be factors to alter the thickness ratio of the first metal film 511 to the second metal film 512. In other words, one skilled in the art may simply alter the magnetic polarization of the first metal, or alter the content of the first metal in the first metal film(s) 511, so as to alter the thickness ratio of the first metal film to the second metal film.

Figure 6:
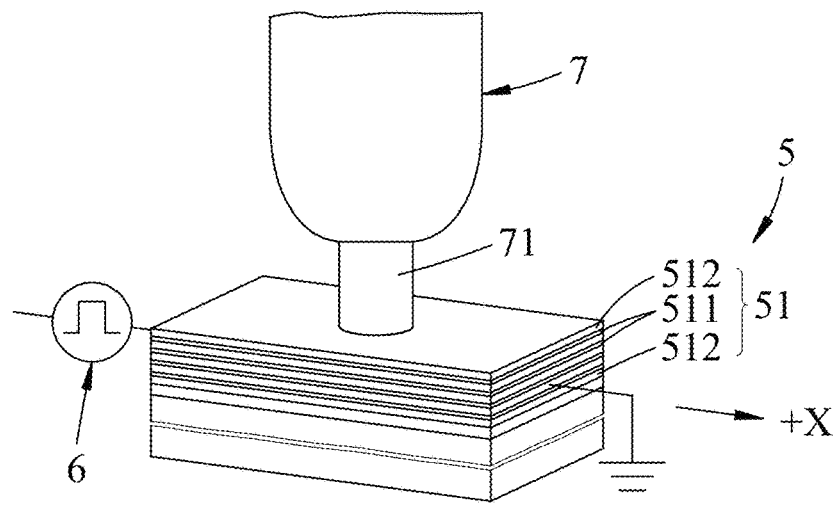
FIG. 6 is a schematic view of the embodiment, illustrating a method of writing the SOT-MRAM.
Figure 7:
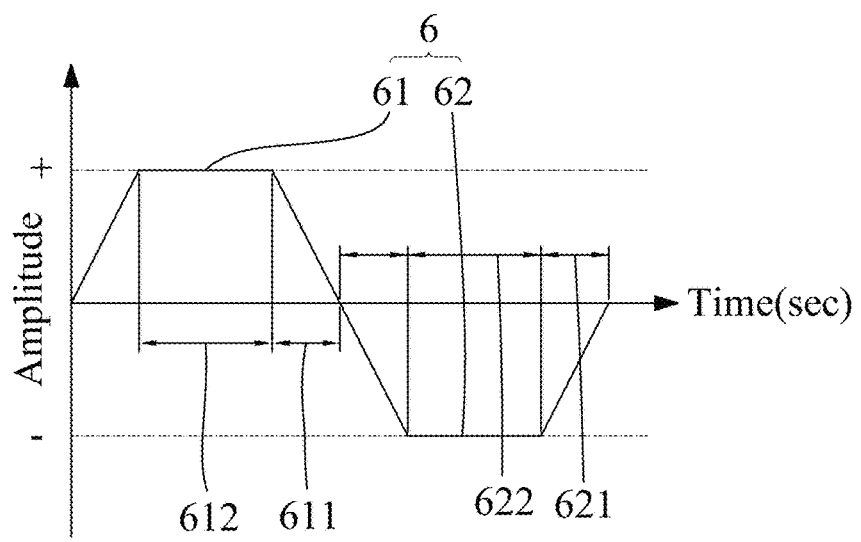
FIG. 7 is a plot illustrating an electric pulse used in the method of the present disclosure.

Referring further to FIGS. 6 and 7, the first metal films 511, upon being applied with a second external magnetic field and an electric pulse 6, have multiple magnetic domains when a current density resulting from the electric pulse 6 is greater in magnitude than a critical value ($J_c$), which is the value at which the magnetic free layer 51 exhibits a switching behavior, i.e., reversal of magnetic moments. In such embodiments, the second external magnetic field may be provided along the first direction (+X) and may be less in magnitude than the first external magnetic field. A magnitude ratio of the first external magnetic field to the second external magnetic field may range from 50:1 to 1000:1.

As shown in FIGS. 6 and 7, one embodiment of a method for writing the aforesaid SOT-MRAM may include the steps as follows.

Step (A): applying the first external magnetic field to the magnetic free layer 51 of the SOT memory cell 5 and subsequently removing the first external magnetic field, such that the first metal film 511 has a remanent-to-saturated magnetization ratio ranging from −0.9 to 0.9. In certain embodiments, the first external magnetic field may be applied along the first direction (+X), i.e., along the hard axis of the first metal film 511, and may range from 5 kOe to 18 kOe.

Step (B): applying the second external magnetic field and a first electric pulse 61, such that the second metal film 512 generates a first self-spinning current via the spin-Hall effect and reverses magnetic moments of the first metal film 511 upon a resulting current density reaching the critical value ($J_c$), wherein the magnetic free layer 51 exhibits one of positively-saturated and negatively-saturated magnetizations upon the current density reaching the critical value ($J_c$). In certain embodiments, the second external magnetic field may range from −900 Oe to 900 Oe. The first electric pulse 61 may have a fall time 611 sufficiently short to allow the first metal film 511 to exhibit multiple magnetic domains. In certain embodiments, the fall time 611 for the first electric pulse 61 may be less than 1000 ns. In such embodiments, the fall time 611 for the first electric pulse 61 may be greater than or equal to 8.4 ns. In certain embodiments, a duration time 612 of the first electric pulse 61 may range from 50 ns to 1 ms. The magnetization of the magnetic free layer 51 may be monitored by a focused polar magneto-optical Kerr effect (FMOKE) system 7 with a laser spot 71.

It may be noted that, when the current density surpasses the critical value ($J_c$), the magnetization of the magnetic free layer 51 changes continuously as the magnitude of the current density increases. In certain embodiments, when the current density is above the critical value ($J_c$), the magnetization of the magnetic free layer 51 has negative correlation to the magnitude of the current density.

Step (C): when the current density of the magnetic free layer 51 is above the critical value ($J_c$), assigning one of a plurality of logic states to the SOT memory cell 5 based on the current density. The plurality of the logic states may be correspondingly assigned to certain predetermined current density values which are larger in magnitude than the critical value ($J_c$).

In certain embodiments, the method may further comprise a step (D): applying the second external magnetic field and a second electric pulse 62, which is opposite in direction to the first electric pulse 61, to the magnetic free layer 51 of the SOT memory cell 5, such that the second metal film(s) 512 generates a second self-spinning current via the spin-Hall effect and reverses the magnetic moments of the first metal film 511 upon the current density reaching the critical value ($J_c$), wherein the magnetic free layer 51 has the other one of the positively and negatively saturated magnetizations upon the current density reaching the critical value ($J_c$). It may be noted that, a duration time 622, as well as a fall time 621 of the second electric pulse 62 may be identical in magnitude but opposite in direction to those of the first electric pulse 61, respectively.

Figure 8:
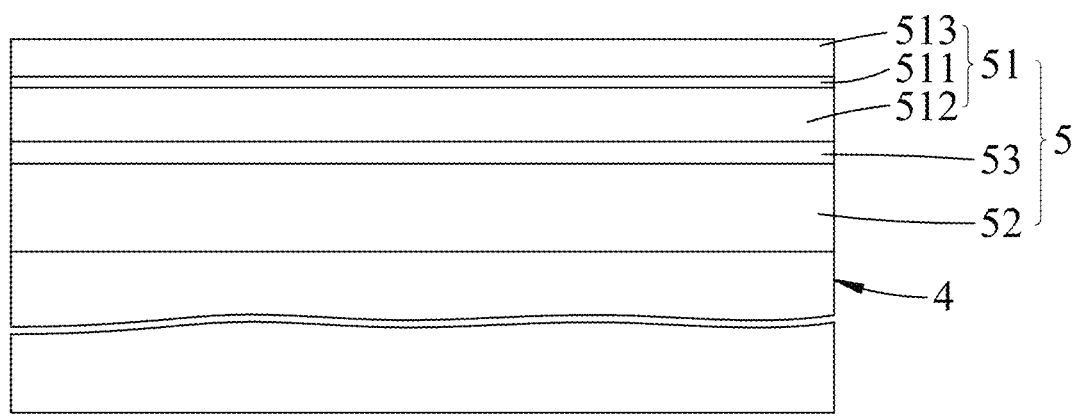
FIG. 8 is a schematic front view illustrating another embodiment of the SOT-MRAM according to the present disclosure.

Referring to FIG. 8, another embodiment of the SOT-MRAM according to the present disclosure is similar to the embodiment shown in FIG. 5, with the differences being described as follows. In such embodiment, the magnetic free layer 51 includes one single first metal film 511 and one single second metal film 512. The magnetic free layer 51 of this embodiment further includes an insulating film 513 contacting the first metal film 511, such that the first metal film 511 exhibits perpendicular magnetic anisotropy. In such embodiment, the first metal film 511 may include Co, Fe, and B, and the second metal film 512 may be made of Pd. In such embodiment, a thickness ratio of the first metal film 511 to the second metal film 512 may range from 0.05 to 0.5.

The configuration of SOT memory cell 5 allows the SOT-MRAM of the present disclosure to achieve multilevel storage with relatively small occupied volume, so as to effectively improve the storage density of the same. Moreover, the writing method of the SOT-MRAM requires no initialization step and effectively increases the writing speed of the SOT-MRAM of the present disclosure.

It should be noted that, although the first metal film 511 may exhibit perpendicular magnetic anisotropy, i.e., the hard axis is parallel to the first direction (+X) and the easy axis is perpendicular to the first direction, the present disclosure is not limited thereto.

It should also be noted that, one skilled in the art may readily appreciate that the magnetic free layer 51 plays a key role in the SOT memory cell 5 as a major component for recording the logic states thereof. Thus, the following examples, as well as the comparative examples, will be described in further detail with respect to magnetization (or Kerr Intensity) of the magnetic free layer 511 instead of resistance states of the SOT memory cell 5.

Example 1 (E1)

A 2.5 nm-thick Ta layer was first deposited onto a thermally-oxidized Si(100) wafer by DC magnetron sputtering, followed by depositing (Pt/Co)$_2$/Pt multilayers and a capping layer of Ta to form a multilayered structure, where each Pt layer has a thickness of 2 nm and each Co layer has a thickness of 0.9 nm (a thickness ratio of the Co layer to the Pt layer being 0.45). Basic magnetic properties of the multilayered structure were measured by a vibrating sample magnetometer (VSM), including saturation magnetization (Ms) and the magnetic anisotropy field (Hk). A first magnetic field of ~18 kOe was applied to the multilayered structure and subsequently removed, and the remanent-to-saturated magnetization was extracted. Thereafter, the multilayered structure was patterned into 5 μm wires by photolithography and reactive-ion etching, and a 10 nm-thick layer of Ta and a 100 nm-thick of Pt were further fabricated on the multilayered structure as a top electrode by photolithography, DC magnetron sputtering, and lift-off process, so as to obtain the SOT memory cell 5 of Example 1. The overall structure of the SOT memory cell 5 of E1 on the silicon substrate in a bottom-up direction is Ta(2.5 nm)/[Pt(2 nm)/Co(0.9 nm)]$_2$/Pt(2 nm)/Ta(2.5 nm)/Ta(10 nm)/Pt(100 nm).

The magnetic properties of the SOT memory cell 5 of Example 1 when writing the same was monitored by a focused polar magneto-optical Kerr effect (FMOKE) system 7 under a laser spot 71 with a diameter of 5 μm. An electric pulse having a duration time of 10 μs and a fall time of 20 ns, and a second magnetic field ($H_x$) of 300 Oe were applied to the SOT memory cell 5 along a longitudinal direction (i.e., the first direction (+X)) of the wires (the SOT memory cell 5), where the electric pulse was provided by an arbitrary waveform generator (Keysight 33509B) and was monitored by an oscilloscope (Tektronix DP05104B). The resulting current density was calculated from the applied voltage, the sample resistance, the cross-sectional area of the wires and the current shunting of the under/capping Ta layers. The result of Example 1 is shown in FIGS. 9 to 16.

Example 2 (E2)

A 7 nm-thick layer of Pd was deposited onto a thermally-oxidized Si(100) wafer by DC magnetron sputtering, followed by depositing a 1 nm-thick $Co_4Fe_4B_2$ layer on the Pd layer to form the magnetic free layer of Example 2. Thereafter, a 2 nm-thick MgO layer (i.e., the insulating film 53) was deposited on the $Co_4Fe_4B_2$ layer by Radio Frequency magnetron sputtering, so as to adjust the magnetic moments of the $Co_4Fe_4B_2$ layer to be perpendicular. A 5 nm-thick Ta layer serving as a capping layer was deposited onto the MgO layer to form a multilayered structure. Basic magnetic properties of the multilayered structure were measured by a vibrating sample magnetometer (VSM), including saturation magnetization ($M_s$) and the magnetic anisotropy field ($H_k$). A first magnetic field of ~18 kOe was applied and subsequently removed, so as to extract the remanent-to-saturated magnetization. Thereafter, the multilayered structure was patterned into 5 μm wires by photolithography and reactive-ion etching, so as to obtain the SOT memory cell 5 of Example 2. The overall structure of the SOT memory cell 5 on the silicon substrate in a bottom-up direction is Pd (7 nm)/$Co_4Fe_4B_2$ (1 nm)/MgO (2 nm)/Ta (5 nm).

The magnetic properties of the SOT memory cell 5 of Example 2 when writing the same was monitored by the focused polar magneto-optical Kerr effect (FMOKE) system 7. An electric pulse having a duration time of 10 μs and a fall time of 20 ns, and a second external magnetic field ($H_x$) of +300 Oe was applied to the SOT memory cell 5 of Example 2 along the longitudinal direction (i.e., the first direction) of the wires (the SOT memory cell 5), where the electric pulse was provided by an arbitrary waveform generator (Keysight 33509B) and was monitored by an oscilloscope (Tektronix DP05104B). The resulting current density was calculated from the applied voltage, the sample resistance, the cross-sectional area of the wires and the current shunting of the under/capping Ta layers. The monitored result of Example 2 is shown in FIGS. 17 to 22.

Comparative Example 1 (CE1)

The SOT memory cell 5 of Comparative Example 1 is similar to that of Example 1, but differs in that the multilayered structure of CE 1 is $(Pt/Co)_1Pt$. In other words, the overall structure of the SOT memory cell 5 of CE1 in the bottom-up direction is Ta(2.5 nm)/[Pt(2 nm)/Co(0.9 nm)]$_1$/Pt(2 nm)/Ta(2.5 nm)/Ta(10 nm)/Pt(100 nm).

Comparative Example 2 (CE2)

The memory cell 5 of Comparative Example 2 is similar to that of Example 1, but differs in that the multilayered structure of CE 2 is $(Pt/Co)_4Pt$. In other words, the overall structure of the SOT memory cell 5 of CE2 in the bottom-up direction is Ta(2.5 nm)/[Pt(2 nm)/Co(0.9 nm)]$_4$/Pt(2 nm)/Ta (2.5 nm)/Ta (10 nm)/Pt (100 nm).

[Data Analysis]

Figure 9:
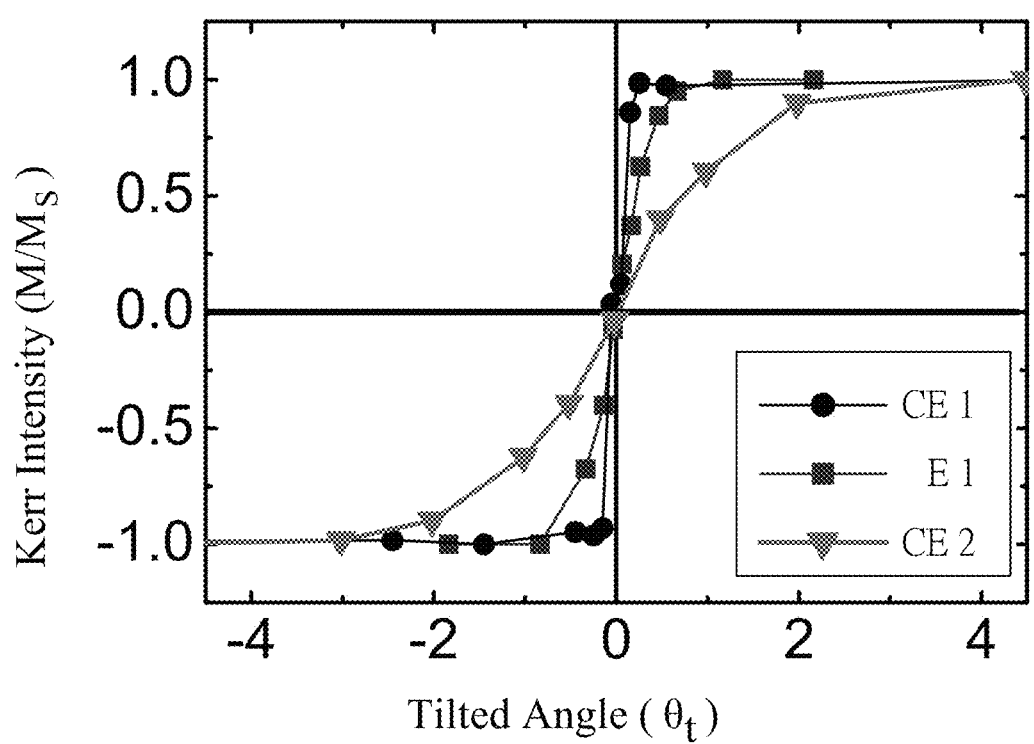
FIG. 9 is a graph illustrating the relationship between the Kerr Intensity (i.e., a remanent-to-saturated Magnetization ratio, $M/M_s$) and the tilted angle for each of Example 1, Comparative Example 1 and Comparative Example 2.

As shown in FIG. 9, after the first magnetic field of ~18 kOe was applied and subsequently removed (i.e., the tilted angle θt=0°), the magnetic free layer 51 of each of E1, CE1 and CE2 has a remanent-to-saturated magnetization ratio (the Kerr Intensity) equal to zero, showing that the magnetic free layer 51 of each of E1, CE1 and CE2 indeed has multiple magnetic domains.

Figure 10:
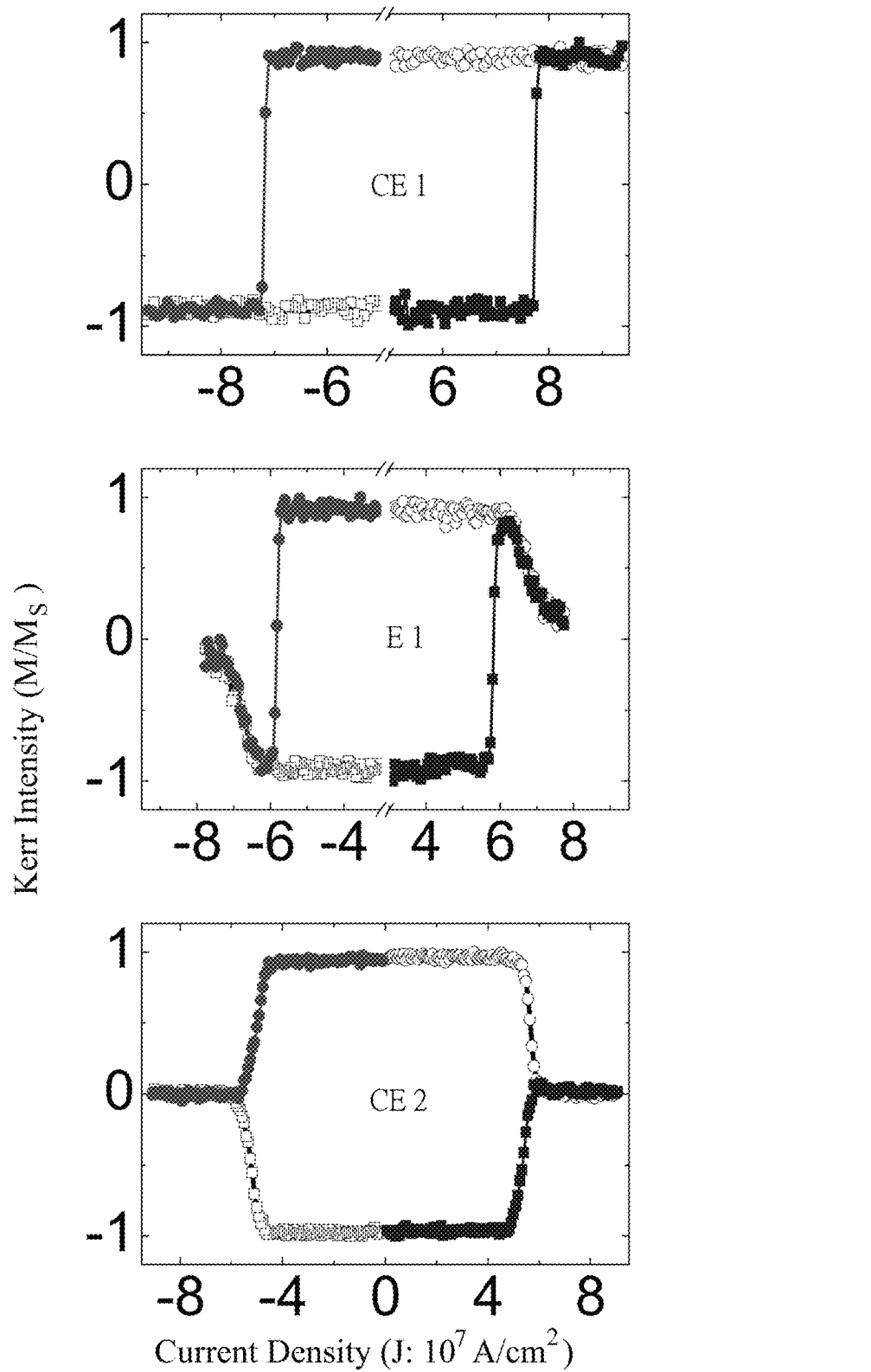
FIG. 10 illustrates the relationship between the Kerr Intensity and the current density for each of E1, CE1 and CE2.

FIG. 10 illustrates the relationship between the Kerr intensity and the current density for each of E1, CE1 and CE2. As shown in FIG. 10, when the current density of CE 1 is greater in magnitude than its critical value ($J_c=\pm 7.7\times 10^7$ A/cm$^2$), the SOT memory cell 5 of CE 1 shows the ordinary binary switching behavior. When the current density of CE 2 is greater in magnitude than its critical value ($J_c=\pm 6\times 10^7$ A/cm$^2$), the SOT memory cell 5 of Comparative Example 2 is in a demagnetized state (where the Kerr Intensity is 0). When the current density of Example 1 is greater in magnitude than its critical value ($J_c=\pm 6\times 10^7$ A/cm$^2$), the magnetization of the magnetic free layer 51 changes continuously as the current density increases. Moreover, the magnetization of the magnetic free layer 51 of Example 1 has negative correlation to the current density. It surely proves that under the circumstances where the fall time of the electric pulse is 20 ns and the current density is above the critical value ($J_c$), each Co film, i.e., the first metal film 511, can achieve initialization-free multilevel memory storage by assigning several logic states to various predetermined current density values above the critical value ($J_c$).

It may be noted that, under the circumstances where the fall time of the electric pulse is 20 ns, the critical value ($J_c$) of the current density for the SOT memory cell 5 of E1 increases from $5.7\times 10^7$ A/cm$^2$ to $8\times 10^7$ A/cm$^2$ as the duration time of the electric pulse decreases from 1 ms to 50 ns. Moreover, when the current density is above the critical value ($J_c$), magnetization of the SOT memory cell 5 of E1 changes continuously as the current density increases, proving that each first metal film 511 indeed exhibits multiple magnetic domains.

Figure 11:
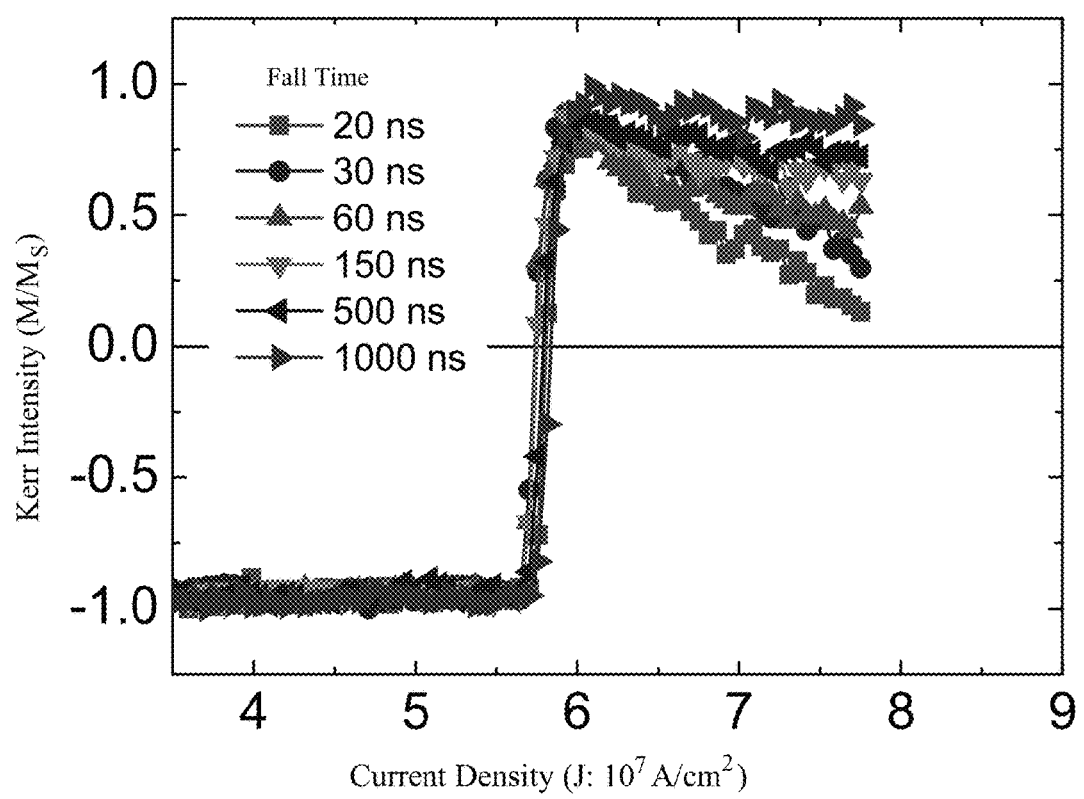
FIG. 11 is a graph illustrating the relationship between the Kerr Intensity the current density for E1 under electric pulses with various fall times.

It may also be noted that, under the circumstances where the duration time of the electric pulse is 10 ps, the fall time thereof ranges from 20 ns to less than 1000 ns, and where the current density is above the critical value ($J_c$), the Kerr intensity of the magnetic free layer 51 changes continuously as the current density increases as illustrated in FIG. 11, showing that the magnetic free layer 51 of E1 exhibits multiple magnetic domains when the fall time of the electric pulse is less than 1000 ns. In addition, with the prolonged duration time (from 20 ns to 1000 ns), the multi-domain formation of the magnetic free layer 51 when the current density is above the critical value ($J_c$) is gradually suppressed and eventually replaced by binary SOT switching.

Figure 12:
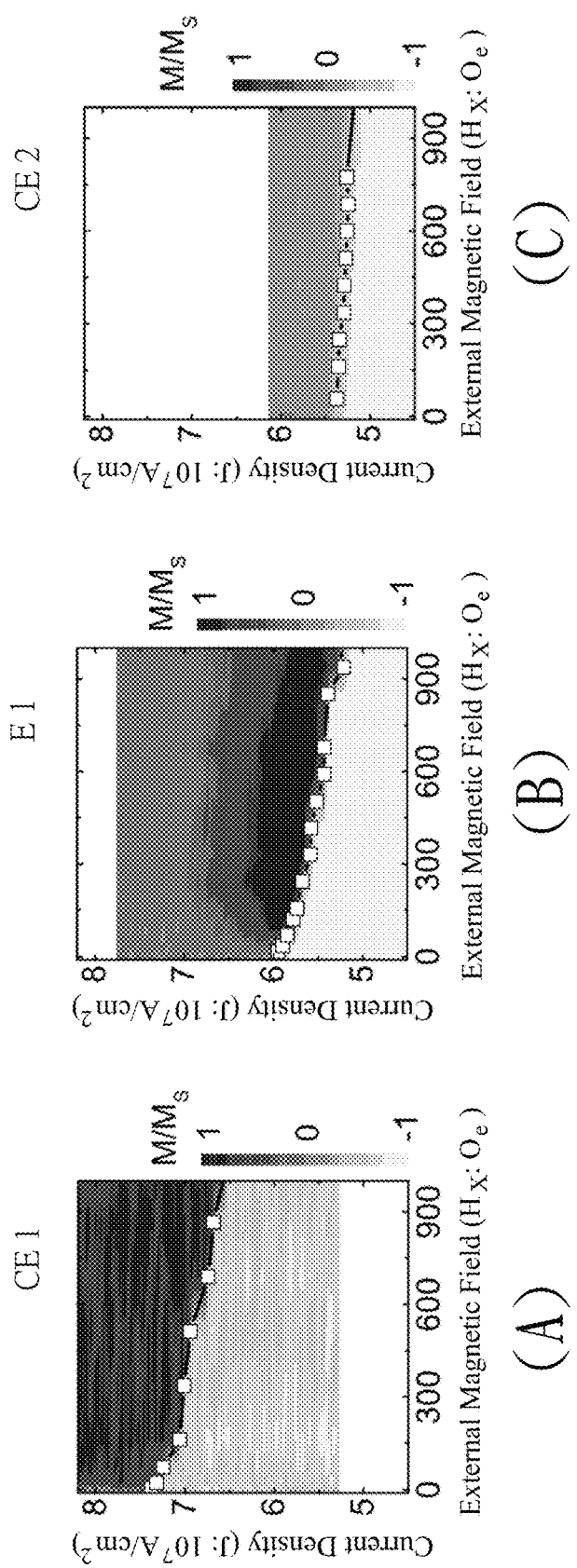
FIG. 12 illustrates switching phase diagrams of E1, CE1 and CE2 with respect to the Kerr Intensity, the current density, and a second external magnetic field.

FIG. 12 shows SOT switching phase diagrams with respect to the Kerr intensity, the applied second external magnetic field and the current density for each of CE1 (section (a) of FIG. 12), E1 (section (b) of FIG. 12), and CE2 (section (c) of FIG. 12), under the circumstances where the duration time and the fall time of the electric pulse are respectively 10 μs and 20 ns. It is shown in section (a) of FIG. 12 that, for Comparative Example 1, the memory cell 5 shows an ordinary binary switching behavior (the Kerr Intensity changes from −1 to 1) when the current density surpasses the critical value. As shown in section (c) of FIG. 12, the memory cell 5 of CE2 is demagnetized (i.e., the Kerr intensity is equal to 0) when the current density surpasses the critical value. As for Example 1, when the current density of the SOT memory cell 5 surpasses the critical value, a relatively large region above the critical current density line shown in the phase diagram illustrates that magnetization of the SOT memory cell 5 can be manipulated within such region to achieve multilevel storage.

Figure 13:
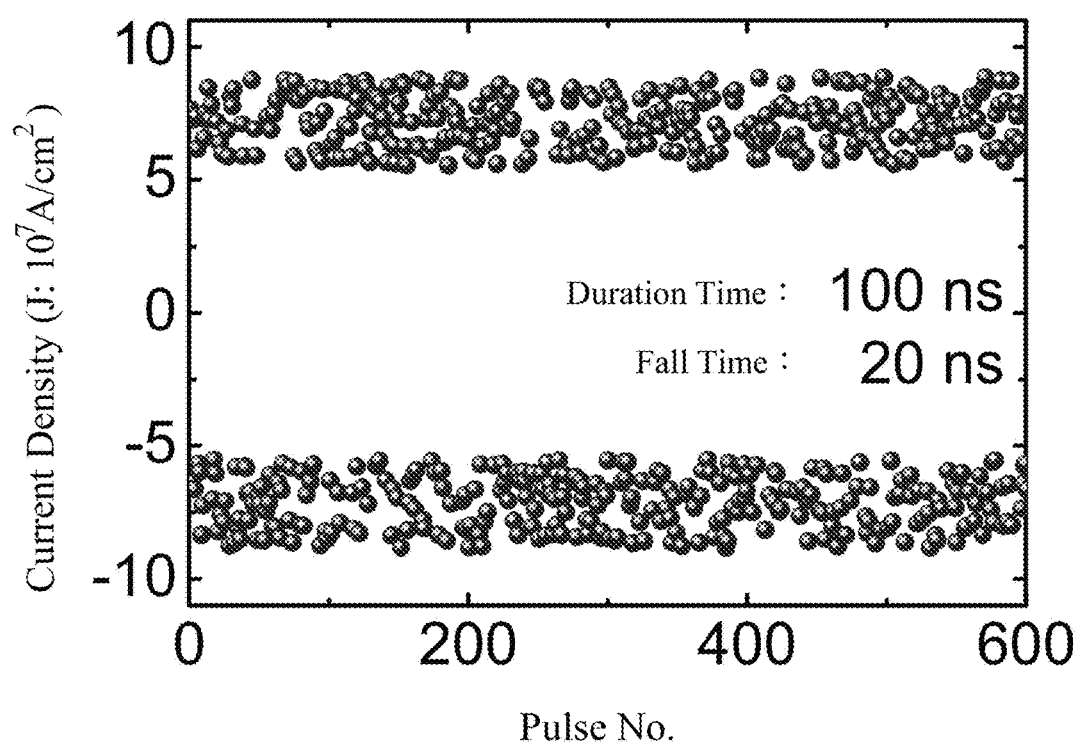
FIG. 13 is a graph illustrating the current densities of 600 sequential pulses applied to the SOT-MRAM of E1.
Figure 14:
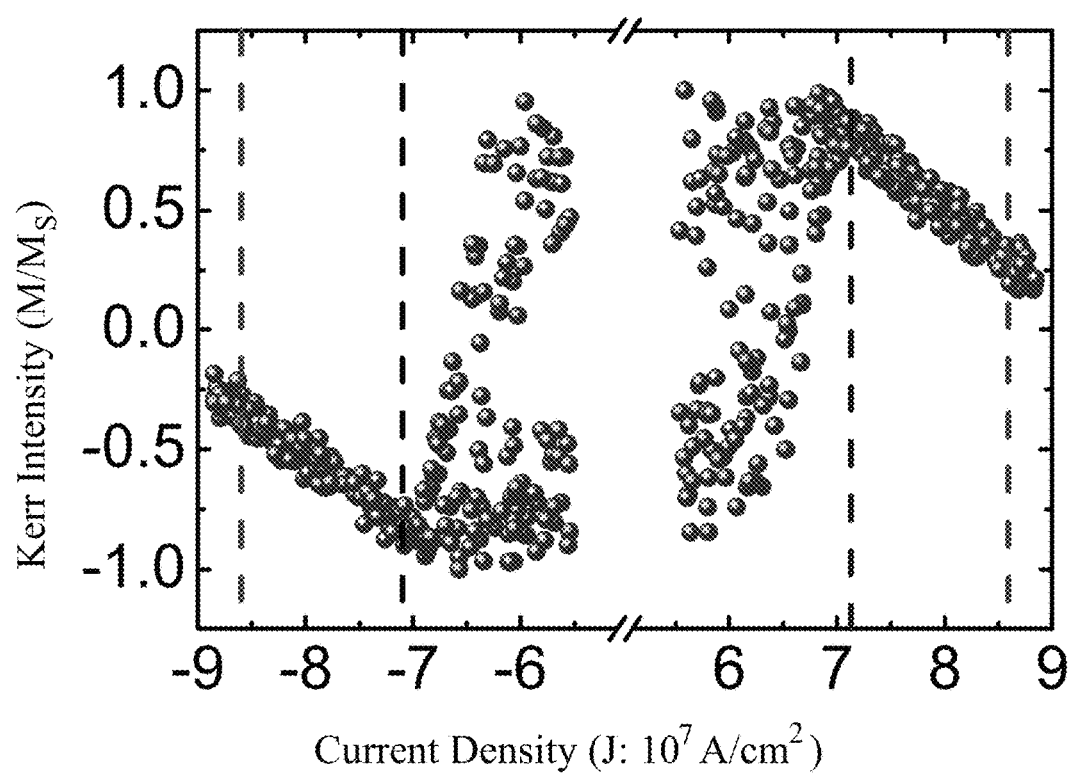
FIG. 14 is a graph illustrating the relationship between the Kerr Intensity and the current density for the 600 sequential pulses shown in FIG. 13.
Figure 15:
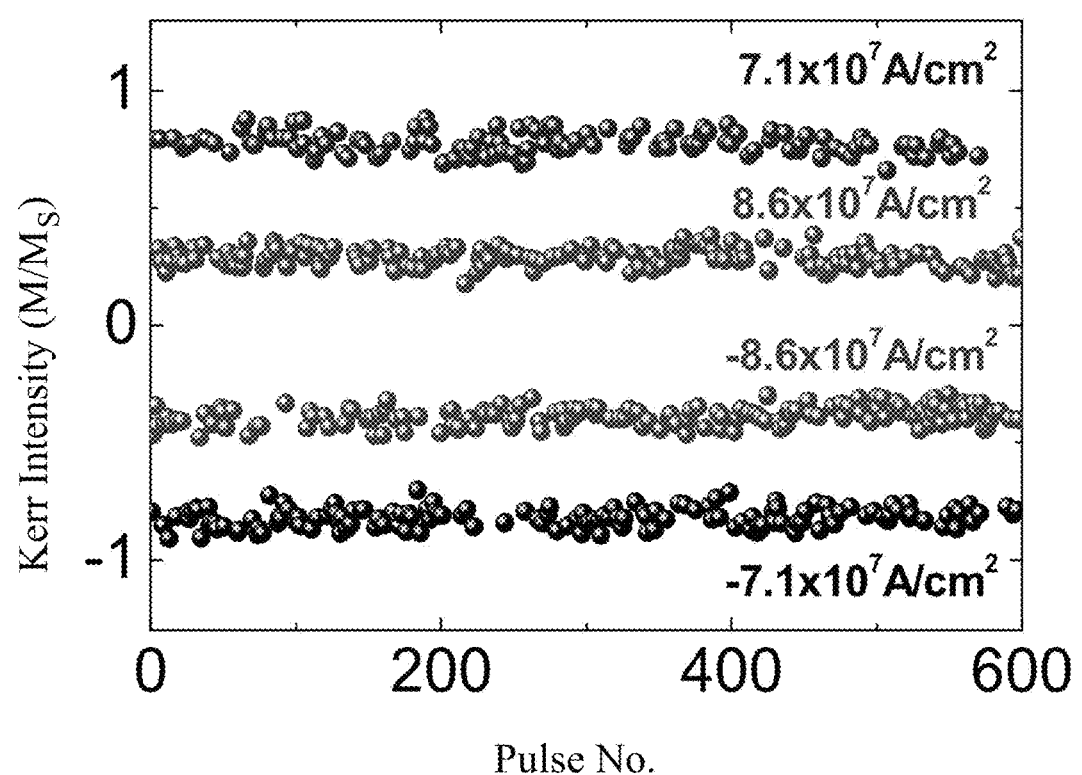
FIG. 15 is a graph illustrating the current density of 600 sequential pulses with four different pulse conditions applied to the SOT-MRAM of E1.
Figure 16:
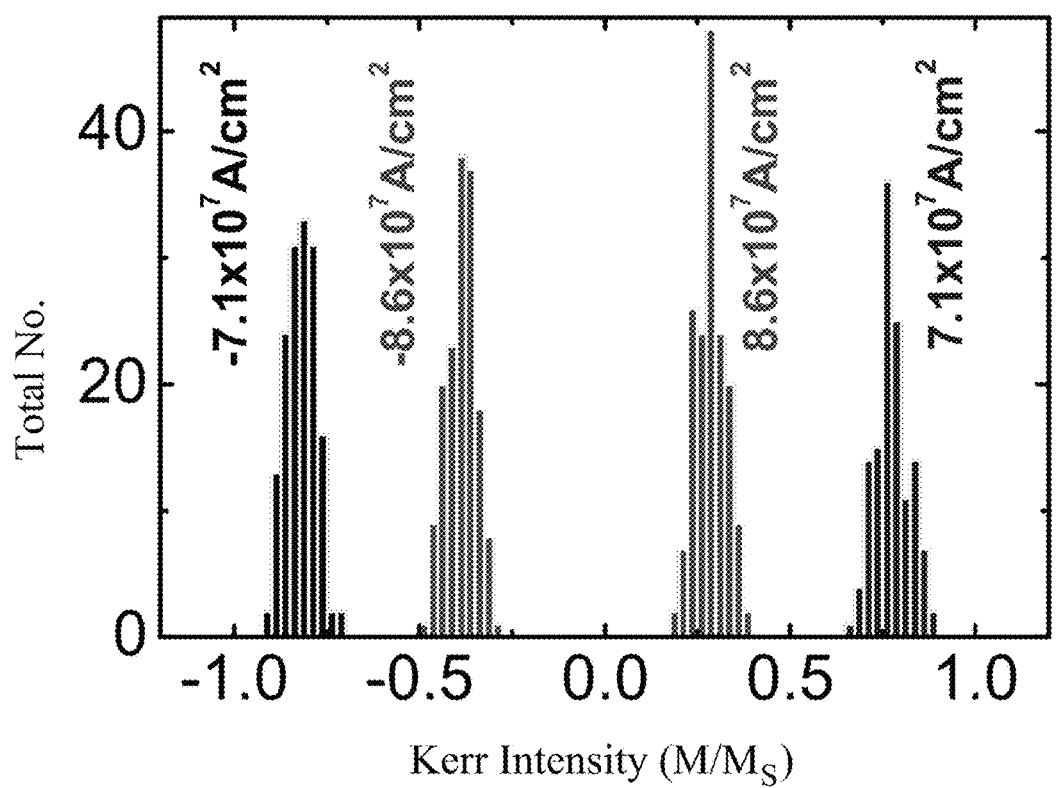
FIG. 16 is a histogram showing the counting number with respect to the Kerr Intensity for the 600 sequential pulses in FIG. 15.

Referring further to FIGS. 13 to 16, multilevel states of the SOT memory cell 5 of E1 are further demonstrated. FIGS. 13 and 14 show 600 sequential pulses (duration time=100 ns and fall time=20 ns) with arbitrarily modulated pulse amplitudes and randomly alternating directions, where the second external magnetic field is +300 Oe and the current density of these pulses are within $5.5 \times 10^7$ A/cm$^2$ to $8 \times 10^7$ A/cm$^2$ (in both positive and negative directions). FIG. 14 shows the distribution of the final magnetization states of the SOT memory cell 5 of E1 after the 600 sequential random pulses as shown in FIG. 13. From FIG. 14 it is clearly shown that, when the current density is lower than the critical value ($J_c = \pm 6.9 \times 10^7$ A/cm$^2$), the final magnetization of the SOT memory cell 5 of E1 substantially remains at its initial value. When the current density surpasses the critical value ($J_c$), the resultant magnetization of the SOT memory cell 5 of E1 changes continuously as the current density increases, and is independent of the preceding pulse conditions. FIGS. 15 and 16 show 600 sequential pulses of 100 ns duration time with four randomly alternating pulse conditions (J=$\pm 7.1 \times 10^7$ A/cm$^2$ and $\pm 8.6 \times 10^7$ A/cm$^2$). As shown in FIG. 15, the resultant magnetizations of the SOT memory cell 5 of E1 are well separated and show no trace of initialization influences. The histogram for the multilevel states is shown in FIG. 16, where the standard deviation of the distribution for each magnetic state is around 4% to 5% M/M$_s$, in which 2% to 3% M/M$_s$ may be attributed to the noise and time dependent variations from the FMOKE system 7. Hence, the result proves that the SOT-MRAM according to the present disclosure surely can achieve multilevel storage without any initialization step.

Figure 17:
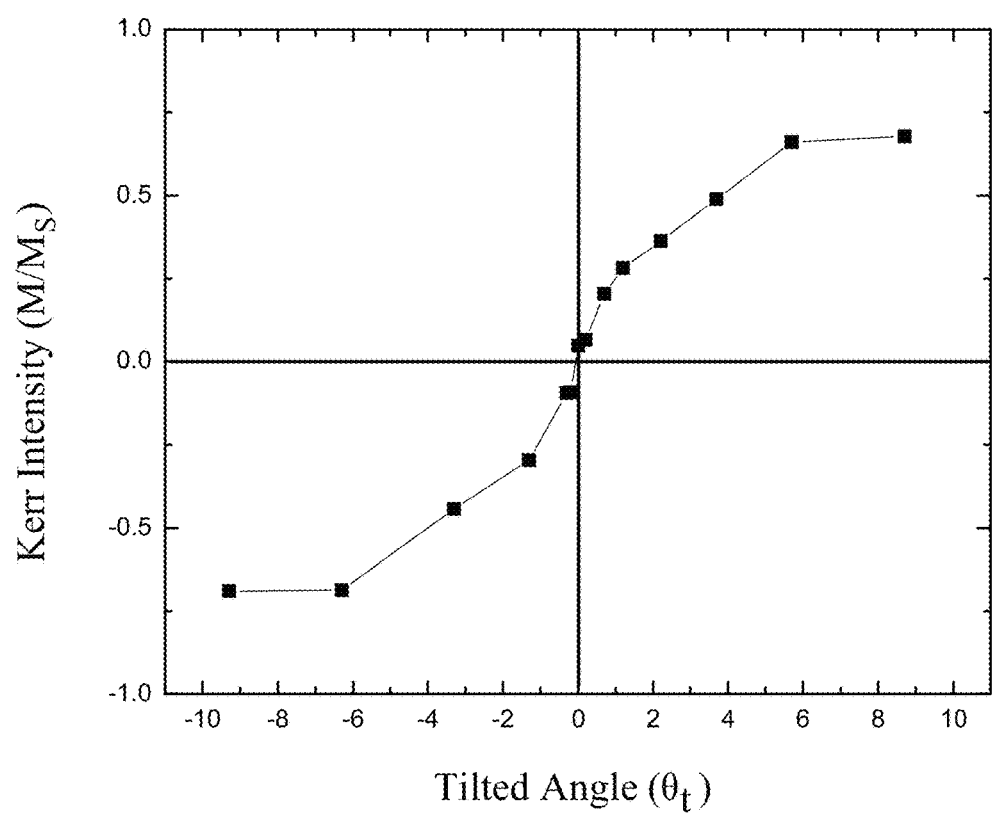
FIG. 17 is a graph illustrating the relationship between the Kerr Intensity and the tilted angle for Example 2.

FIG. 17 shows the relationship between the Kerr Intensity of E2 and the tilted angle ($\theta_t$). As shown in FIG. 17, after the first magnetic field of ~18 kOe was applied and subsequently removed (i.e., the tilted angle $\theta_t = 0°$), the magnetic free layer 51 of E2 has a remanent-to-saturated magnetization ratio (the Kerr Intensity) equal to zero, showing that the magnetic free layer 51 of E2 indeed has multiple magnetic domains.

Figure 18:
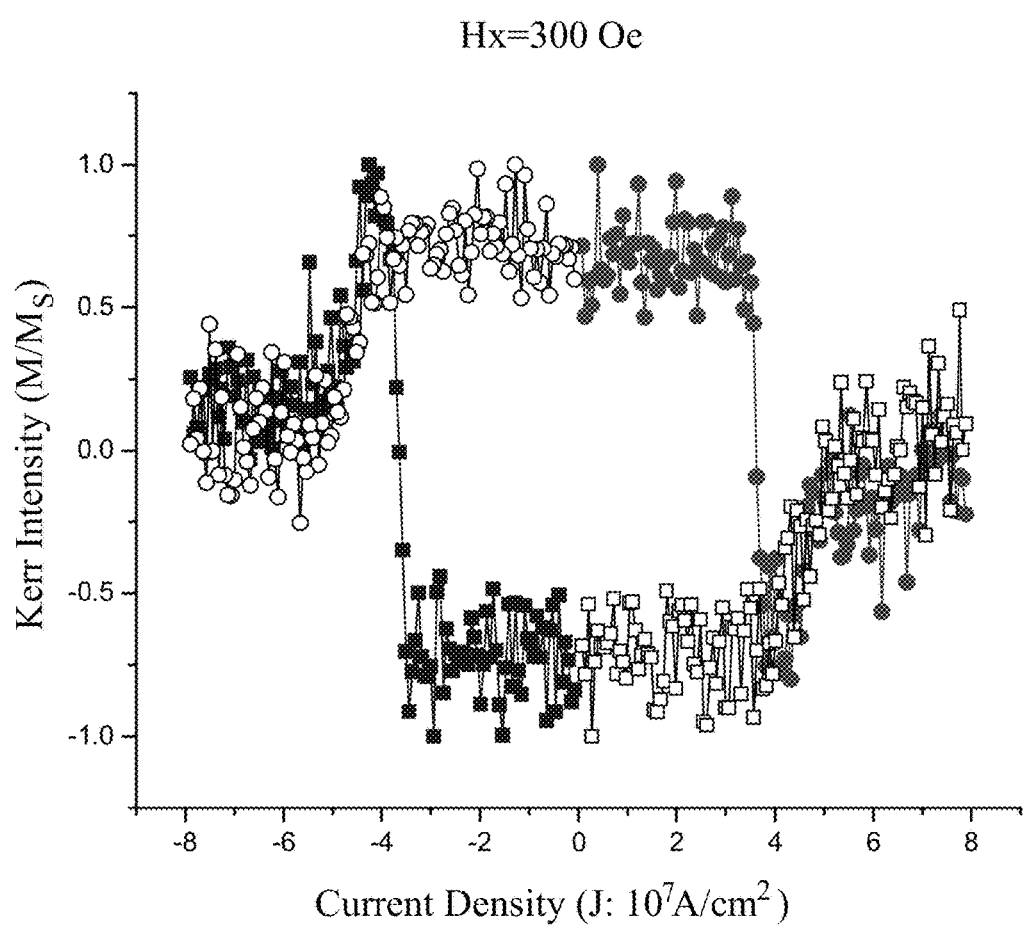
FIG. 18 illustrates the relationship between the Kerr Intensity and the current density for E2.

FIG. 18 illustrates the relationship between the Kerr intensity and the current density for E2. When the current density of E2 is greater than its critical value ($J_c = \pm 4 \times 10^7$ A/cm$^2$), the magnetization of the magnetic free layer 51 changes continuously as the amplitude of the current density increases. Moreover, the magnetization of the magnetic free layer of Example 2 has negative correlation to the current density. It surely proves that under the circumstances where the fall time of the electric pulse is 20 ns and the current density is above the critical value ($J_c$), each Co$_4$Fe$_4$Be$_2$ film, i.e., the first metal film 511, can achieve initialization-free multilevel memory storage with relatively small occupied volume by assigning several logic states to various predetermined current density values above the critical value ($J_c$), i.e., various magnetization states.

Figure 19:
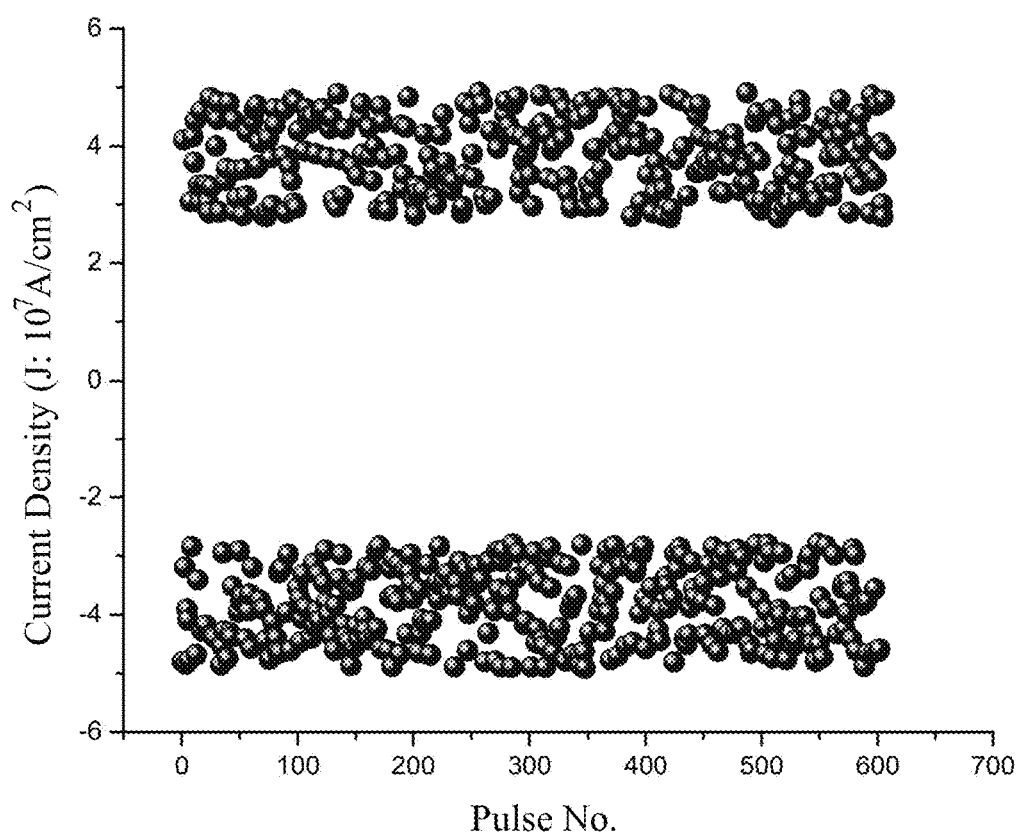
FIG. 19 is a graph illustrating the current densities of 600 sequential pulses applied to the SOT-MRAM of E2.
Figure 20:
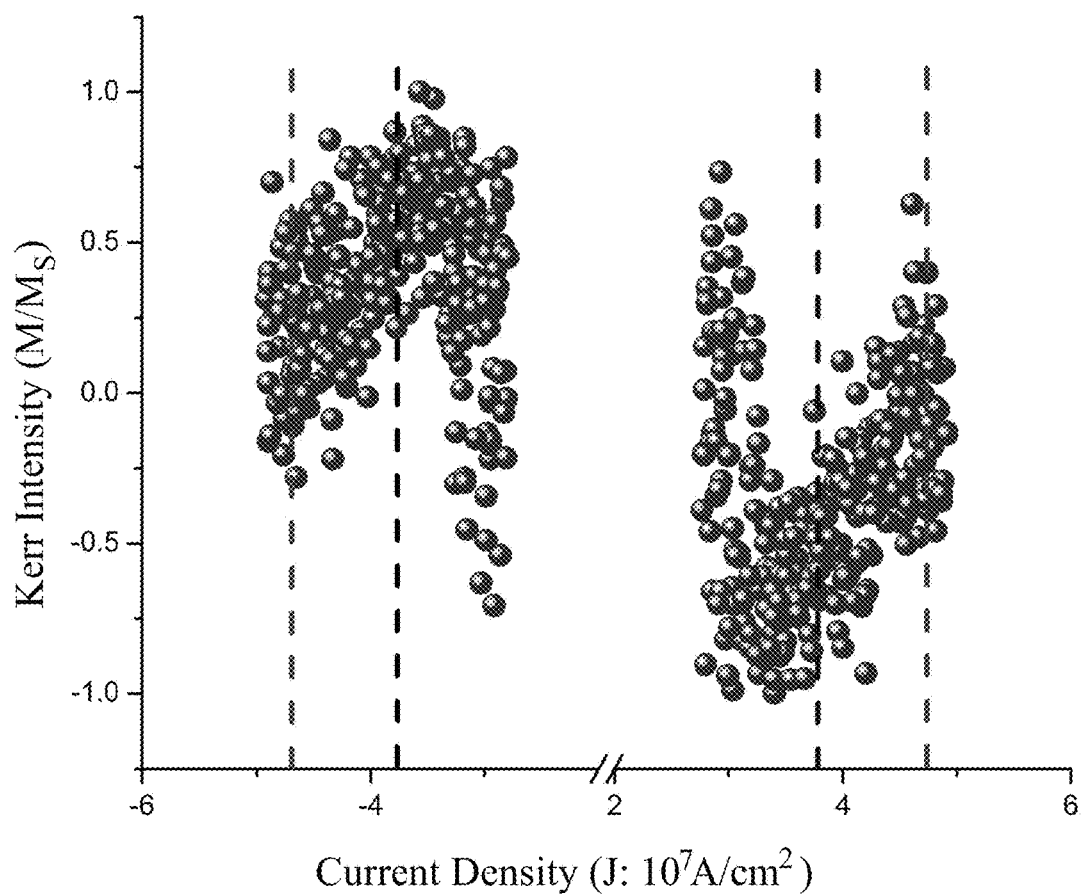
FIG. 20 is a graph illustrating the relationship between the Kerr Intensity and the current density for the 600 sequential pulses shown in FIG. 19.
Figure 21:
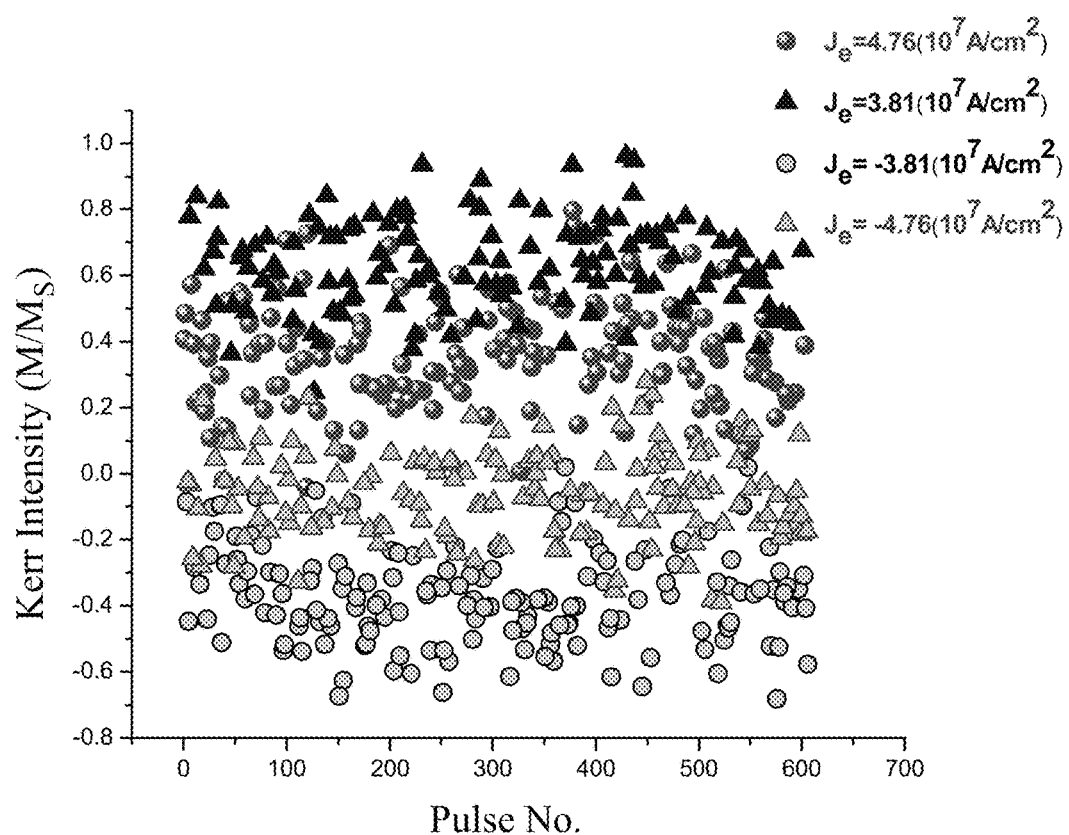
FIG. 21 is a graph illustrating the current density of 600 sequential pulses with four different pulse conditions applied to the SOT-MRAM of E2.
Figure 22:
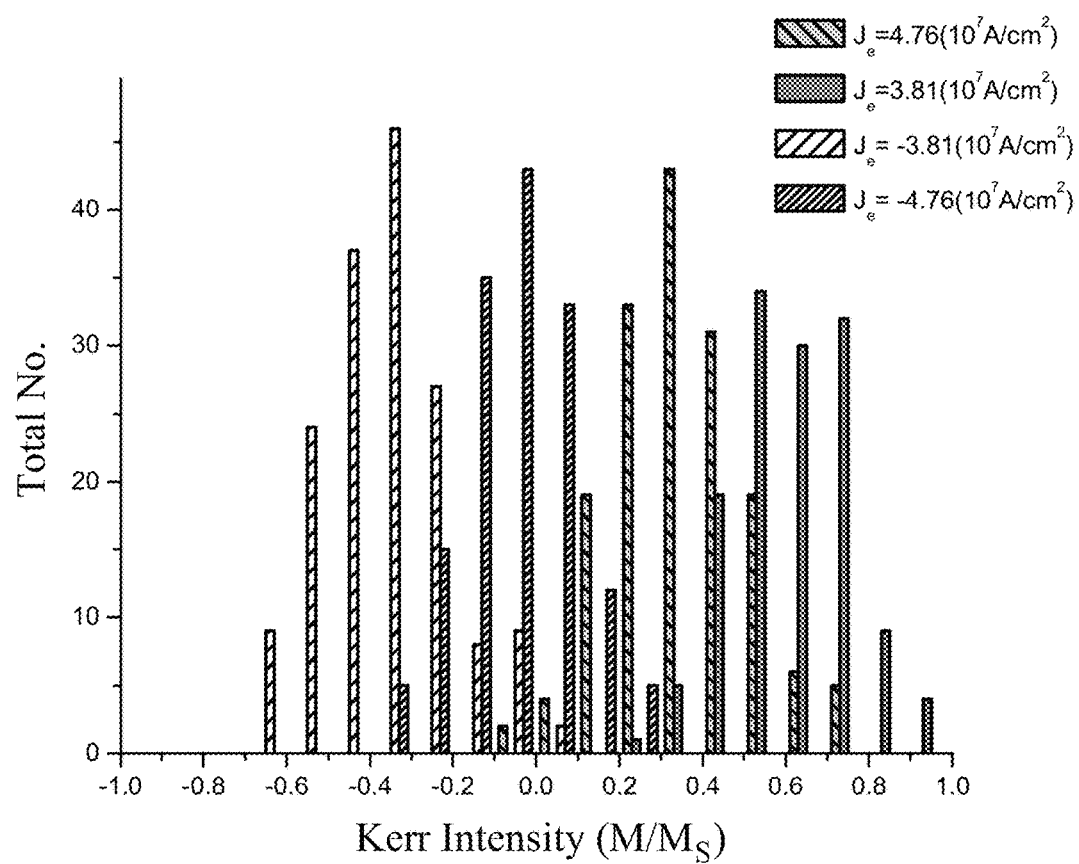
FIG. 22 is a histogram showing the counting numbers with respect to the Kerr Intensity for the 600 sequential pulses shown in FIG. 21.

FIGS. 19 and 20 show 600 sequential pulses (duration time=100 ns, fall time=20 ns) applied to the SOT memory cell 5 of E2 with arbitrarily modulated pulse amplitudes and randomly alternating directions, where the second external magnetic field ($H_x$) is +300 Oe and the current density of these pulses are within $2.8 \times 10^7$ A/cm$^2$ to $5 \times 10^7$ A/cm$^2$ (in both positive and negative directions). FIG. 20 shows the distribution of the final magnetization states of the SOT memory cell 5 of E1 after the 600 sequential random pulses as shown in FIG. 19. From FIG. 19 it is clearly shown that, when the current density is lower than the critical value ($J_c = +3.5 \times 10^7$ A/cm$^2$), the final magnetization of the SOT memory cell 5 of E2 substantially remains at its initial value. When the current density surpasses the critical value ($J_c$), the resultant magnetization of the SOT memory cell 5 of E2 changes continuously as the current density increases, and is independent of the preceding pulse conditions. FIGS. 21 and 22 show 600 sequential pulses of 100 ns duration time with four randomly alternating pulse conditions (J=$\pm 3.81 \times 10^7$ A/cm$^2$ and $\pm 4.76 \times 10^7$ A/cm$^2$). As shown in FIG. 21, the resultant magnetizations of the SOT memory cell 5 of E2 are separated and show no trace of initialization influences. The histogram for the multilevel states is shown in FIG. 22, where the standard deviation of the distribution for each magnetic state is around 12% to 15% M/M$_s$, in which 6% to 7.5% M/M$_s$ may be attributed to the noise and time dependent variations from the FMOKE system 7.

In summary, the configuration of the SOT memory cell 5 allows the SOT-MRAM of the present disclosure to achieve multilevel storage with relatively small occupied volume, so as to effectively improve the storage density. Moreover, the writing method of the SOT-MRAM requires no initialization step and effectively increases the writing speed of the SOT-MRAM of the present disclosure.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A spin-orbit torque magnetic random access memory (SOT-MRAM), comprising:
    a substrate; and
    an SOT memory cell disposed on said substrate and including a magnetic free layer, said magnetic free layer including a first metal film exhibiting ferromagnetic characteristics, and a second metal film contacting said first metal film for generating a spin-Hall effect,
    wherein said first metal film has a thickness sufficient to allow said magnetic free layer, after being applied with a first external magnetic field which is subsequently removed, to have a remanent-to-saturated magnetization ratio ranging from −0.9 to 0.9,
    wherein said first metal film, upon being applied with a second external magnetic field and an electric pulse, has multiple magnetic domains when a current density resulting from said electric pulse is greater than a critical value, said magnetic free layer having a magnetic switching behavior when the current density reaches the critical value, wherein said second external magnetic field is provided in a direction identical to said first external magnetic field and less in magnitude than said first external magnetic field.

2. The SOT-MRAM of claim 1, wherein said magnetic free layer exhibits saturated magnetization when the current density reaches the critical value.

3. The SOT-MRAM of claim 1, wherein:
said first metal film includes a first metal selected from the group consisting of Co, Fe, Ni and combinations thereof;
said second metal film is made of one of a second metal, and a third metal doped with a fourth metal;
said second metal is selected from the group consisting of Pd, Pt, Ta, Mo, and W;
said third metal is selected from the group consisting of Cu, Pt, W and combinations thereof; and
said fourth metal is selected from the group consisting of Ir, Pt, W, Bi, and combinations thereof.

4. The SOT-MRAM of claim 3, wherein said first metal film includes Co, said second metal film is made of Pt, and said magnetic free layer has a $(Pt/Co)_2/X$ multi layered structure stacked on said substrate, where X is said second metal.

5. The SOT-MRAM of claim 4, wherein X is Pt.

6. The SOT-MRAM of claim 5, wherein a thickness ratio of said first metal film to said second metal film ranges from 0.05 to 1.0.

7. The SOT-MRAM of claim 1, wherein:
said first metal film includes Co, Fe and B;
said second metal film is made of Pd; and
said magnetic free layer further includes an insulating film in contact with said first metal film.

8. The SOT-MRAM of claim 7, wherein a thickness ratio of said first metal film to said second metal film ranges from 0.05 to 0.1.

9. The SOT-MRAM of claim 1, wherein said first metal film exhibits perpendicular magnetic anisotropy.

10. A method for writing the SOT-MRAM of claim 1, comprising:
applying the first external magnetic field to the magnetic free layer of the SOT memory cell and subsequently removing the first external magnetic field, such that the first metal film has a remanent-to-saturated magnetization ratio ranging from −0.9 to 0.9; and
applying the second external magnetic field and a first electric pulse to the magnetic free layer of the SOT memory cell, such that the second metal film generates a first self-spinning current via the spin-Hall effect and reverses magnetic moments of the first metal film upon a resulting current density reaching the critical value, wherein the magnetic free layer has one of positively-saturated and negatively-saturated magnetizations upon the current density reaching the critical value.

11. The method of claim 10, further comprising:
applying a second electric pulse, which is opposite in direction to the first electric pulse, and the second external magnetic field to the magnetic free layer of the SOT memory cell, such that the second metal film generates a second self-spinning current via the spin-Hall effect and reverses the magnetic moments of the first metal film upon the current density reaching the critical value, wherein the magnetic free layer has the other one of the positively-saturated and negatively-saturated magnetizations upon the current density reaching the critical value.

12. The method of claim 10, wherein, when the current density is above the critical value, the magnetization of the magnetic free layer has negative correlation to the current density.

13. The method of claim 10, wherein, when the current density is above the critical value, the magnetization of the magnetic free layer changes continuously as the current density increases.

14. The SOT-MRAM of claim 10, wherein a magnitude ratio of the first external magnetic field to the second external magnetic field ranges from 50:1 to 1000:1.

15. The method of claim 10, wherein said first electric pulse has a fall time sufficiently short to allow said first metal film to have the magnetic domains.

16. The method of claim 10, wherein the fall time for the first electric pulse is less than 1000 ns.

17. The method of claim 10, wherein a duration time of the first electric pulse ranges from 50 ns to 1 ms.

18. The method of claim 10, wherein the first and second magnetic fields are applied along a hard axis of the first metal film.

19. The method of claim 10, further comprising:
when the current density is above the critical value, assigning one of a plurality of logic states to the SOT memory cell based on the current density.

* * * * *